United States Patent [19]

Makino

[11] Patent Number: 6,002,732
[45] Date of Patent: Dec. 14, 1999

[54] METHOD AND APPARATUS FOR ADJUSTING PHASE OF INTERNAL CLOCK SIGNAL

[75] Inventor: Tatsushi Makino, Tokyo, Japan

[73] Assignee: NEC Corporation, Tokyo, Japan

[21] Appl. No.: 08/827,730

[22] Filed: Apr. 8, 1997

[30] Foreign Application Priority Data

May 17, 1996 [JP] Japan ..................................... 8-148150

[51] Int. Cl.⁶ ...................................................... H03D 3/24
[52] U.S. Cl. ........................... 375/374; 324/161; 324/243
[58] Field of Search .................................... 375/371, 373, 375/374; 327/158, 155, 161, 160, 243

[56] References Cited

U.S. PATENT DOCUMENTS

| | | | |
|---|---|---|---|
| 5,767,715 | 6/1998 | Marquis et al. | 327/158 |
| 5,771,264 | 6/1998 | Lane | 375/374 |
| 5,815,016 | 9/1998 | Erickson | 327/158 |
| 5,852,380 | 12/1998 | Yamauchi | 327/243 |

FOREIGN PATENT DOCUMENTS 3217919  9/1991  Japan .

*Primary Examiner*—Temesghen Ghebretinsae
*Attorney, Agent, or Firm*—Whitham, Curtis & Whitham

[57] ABSTRACT

In a phase adjusting circuit, a signal generating circuit generates an internal signal based on an external signal and a feed-back signal. An output circuit outputs to a load circuit the internal signal having a first delay with respect to the generated internal signal from the signal generating circuit. A feed-back signal generating circuit delays the generated internal signal from the signal generating circuit by a sum of a second delay corresponding to the first delay and a third delay corresponding to a load of the load circuit, and outputs the delayed signal as the feed-back signal to the signal generating circuit.

18 Claims, 5 Drawing Sheets

METHOD AND APPARATUS FOR ADJUSTING PHASE OF INTERNAL CLOCK SIGNAL

BACKGROUND OF THE INVENTION

1. Field of the Invention

The present invention relates to a method and apparatus for adjusting a phase of an internal clock signal, and more particularly to a method and apparatus for adjusting an internal clock signal to have the same phase as an external clock signal.

2. Description of Related Art

A first conventional example of a phase adjusting circuit is shown in FIG. 1. Referring to FIG. 1, an external clock signal 1 is inputted to an input terminal 1 of a phase determining circuit 2 of a clock signal generating circuit 3 for phase determination. An output signal 4 of the clock signal generating circuit 3 is separately outputted onto two paths and is supplied to a first selecting circuit 7 and a second selecting circuit 10. The first selecting circuit 7 is a circuit for stopping an internal clock signal 13 in response to an internal clock signal stop control signal 6. The internal clock signal stop control signal 6 is a selection control signal to control the first selecting circuit 7. A first buffer section 11 composed of buffer circuits for the internal clock signal 13 is a section for buffering the internal clock signal 13 which can drive a large load component.

It is necessary that the delay between the output signal 4 of the clock signal generating circuit 3 and the internal clock signal 13 is the same as the delay between the output signal 4 of the clock signal generating circuit 3 and a feed-back clock signal 14. For this reason, there are provided the second selecting circuit 10 which has the same delay as the first selecting circuit 7 and a buffer section 12 composed of buffer circuits which is equivalent to the first buffer section 11. An input terminal of the second selecting circuit 10 for a selection signal 9 is connected to the ground. Accordingly, the second selecting circuit 10 does not function as the selecting circuit and is set to the state in which the output signal 4 of the clock signal generating circuit 3 is always outputted to the buffer section 12.

The feed-back clock signal 14 is supplied to another input terminal of the phase determining circuit 2 of the clock signal generating circuit 3. The phase determining circuit 2 compares the feed-back clock signal 14 and the external clock signal 1 in phase to determine whether the phases are coincident between the feed-back clock signal 14 and the external clock signal 1. It is desirable that the phase of the internal clock signal 13 is coincident with that of the external clock signal 1. However, because the internal clock signal 13 is distributed to the whole of an integrated circuit, a line for the internal clock signal 13 is loaded with a large parasitic capacity. Therefore, the internal clock signal 13 must have the capability to drive the large parasitic capacity and a very large current is consumed when the internal clock signal 13 is activated.

In this manner, the clock signal generating circuit 3 compares the external signal 1 and the feed-back clock signal 14 which has the same delay as the internal clock signal 13 to adjust the phase of the internal clock signal 13. Also, for the above reason, when the internal clock signal 13 is not needed, the internal clock signal 13 is stopped. In this way, reduction of consumption current is adopted.

Further, a time period is necessary for the clock signal generating circuit 3 to adjust the phase of the internal clock signal 13. In a case where the internal clock signal 13 is intermittently activated, the phase adjustment can not follow the internal clock signal and the desired operation can not be satisfied. Therefore, the second selecting circuit 10 and the buffer circuits 12 are provided to generate the feed-back clock signal 14 which has the same phase as the internal clock signal 13 and which always operates. Then, the feed-back clock signal 14 is compared with the external clock signal 1 by the phase determining circuit 2 of the clock signal generating circuit 3 and the phase of the output signal 4 from the clock signal generating circuit is controlled such that a phase difference between the external clock signal 1 and the feed-back clock signal 14 is canceled.

A second conventional example of the clock signal generator which has the structure similar to the abovementioned first conventional example is proposed to Japanese Laid Open Patent Disclosure (JP-A-Heisei 3-217919), as shown in FIG. 2. Referring to FIG. 2, a dummy control signal 59 is provided, which has the same phase as a control signal 56 as an output signal of the output buffer circuit 58, such that the control signal 56 is activated with the same phase as an original external clock signal 52. The dummy control signal 59 and the original control signal 52 are supplied to a phase comparator 66 and the phase of the control signal 56 is adjusted in such a manner that the phase of the original control signal 52 and that of the control signal 56 are coincident with each other.

In the first conventional example, when an external clock signal has a high frequency, it becomes more important for a high-speed operation to cancel a phase difference between the external clock signal and the internal clock signal. This is because the phase difference between the internal clock signal and the external clock signal is a fatal defect since a setup time and a hold time cannot be met in a memory device, in a case where the high-speed data transfer is performed in synchronous with the external clock signal.

In order to solve the above problems, it is necessary that the cancellation of the phase difference between the internal clock signal and the external clock signal is performed with high precision. For this purpose, the cancellation of the phase difference between the internal clock signal and the feed-back clock signal are performed, because the phase difference is equal to the phase difference between the internal clock signal and the feed-back clock signal.

In the above first conventional example, the clock generator is formed in such a manner that the internal clock signal and the feed-back clock signal have the same delay. However, because there is a large difference in parasitic capacity between the internal clock signal and the feed-back clock signal, it is difficult to cancel the phase difference between the internal clock signal and the external clock signal while coping with change of device parameters, change of device temperature and so on.

In the second conventional example, there is also the same problem as the above first conventional example. In the second conventional example, it is described that the dummy control signal 59 has the same phase as the control signal 56. However, because a phase difference is actually present between the dummy control signal 59 and the control signal 56, an operation loss is present in high-speed operation.

SUMMARY OF THE INVENTION

The present invention is accomplished in the light of the above circumstances. Therefore, an object of the present invention is to provide a method and apparatus for generating a clock signal in which a phase difference between an internal clock signal and an external clock signal can be eliminated using a feed back clock signal.

In order to achieve an aspect of the present invention, a phase adjusting circuit includes a signal generating circuit for generating an internal signal based on an external signal and a feed-back signal, an output circuit for outputting to a load circuit the internal signal having a first delay with respect to the generated internal signal from the signal generating circuit, and a feed-back signal generating circuit for delaying the generated internal signal from the signal generating circuit by a sum of a second delay corresponding to the first delay and a third delay corresponding to a load of the load circuit, and for outputting the delayed signal as the feed-back signal to the signal generating circuit.

In this case, the feed-back signal generating circuit includes a first delaying section for delaying the generated internal signal from the signal generating circuit by the second delay corresponding to the first delay to generate a first delayed signal, and a second delaying section for delaying the first delayed signal by the third delay.

The second delaying section determines a phase difference between the internal signal and the first delayed signal, and delays the first delayed signal by the third delay determined based on the phase difference. In this case, the second delaying section includes a comparing circuit for detecting a direction of the phase difference between the internal signal and the first delayed signal, a counter circuit for counting up or down based on the detecting result of the comparing circuit, and a delaying circuit for delaying the first delayed signal by a delay corresponding to a count value from the counter circuit as the third delay. The first delay section stops the output of the generated internal signal from the signal generating section to the load circuit in response to an output control signal, and the counter circuit holds the count value in response to the output control signal.

Alternatively, the second delaying section includes a comparing circuit for detecting a direction of the phase difference between the internal signal and the first delayed signal, a value output circuit for outputting a fixed value previously set based on the detecting result of the comparing circuit, and a delaying circuit for delaying the first delayed signal by a delay corresponding to a count value from the counter circuit as the third delay.

When the value is a N-bit data (N is an integer more than 1), the delaying circuit includes N capacitors having different capacitances, respectively, and N switching elements connected to the N capacitors, wherein the N switching elements are turned on in response to N bits of the count value, respectively, such that the first delayed signal is delayed by the third delay. In this case, a M-th capacitor ($2 \leq M \leq N$: M is an integer) of the N capacitors has a capacitance of $L \times 2^{M-1}$ (L is a capacitance of a first capacitor).

In order to achieve another aspect of the present invention, a phase adjusting circuit includes a signal generating circuit for generating an internal signal based on an external signal and a feed-back signal, an output circuit for outputting to a load circuit the internal signal having a first delay with respect to the generated internal signal from the signal generating circuit, and a feed-back signal generating circuit for monitoring the internal signal, dynamically delaying by a sum of a second delay corresponding to the first delay and a third delay corresponding to a load of the load circuit, and for outputting the delayed signal as the feed-back signal to the signal generating circuit.

In order to achieve still another aspect of the present invention, a method of adjusting a clock signal, includes the steps of:

generating an original clock signal based on an external signal and a feed-back signal;

generate and outputting to a load circuit an internal clock signal having a first delay with respect to the original clock signal; and delaying the original clock signal by a sum of a second delay corresponding to the first delay and a third delay corresponding to a load of the load circuit to generate the feed-back clock signal.

DESCRIPTION OF THE PREFERRED EMBODIMENTS

A phase adjusting circuit of the present invention will be described below in detail with reference to the accompanying drawings.

Figure 1:
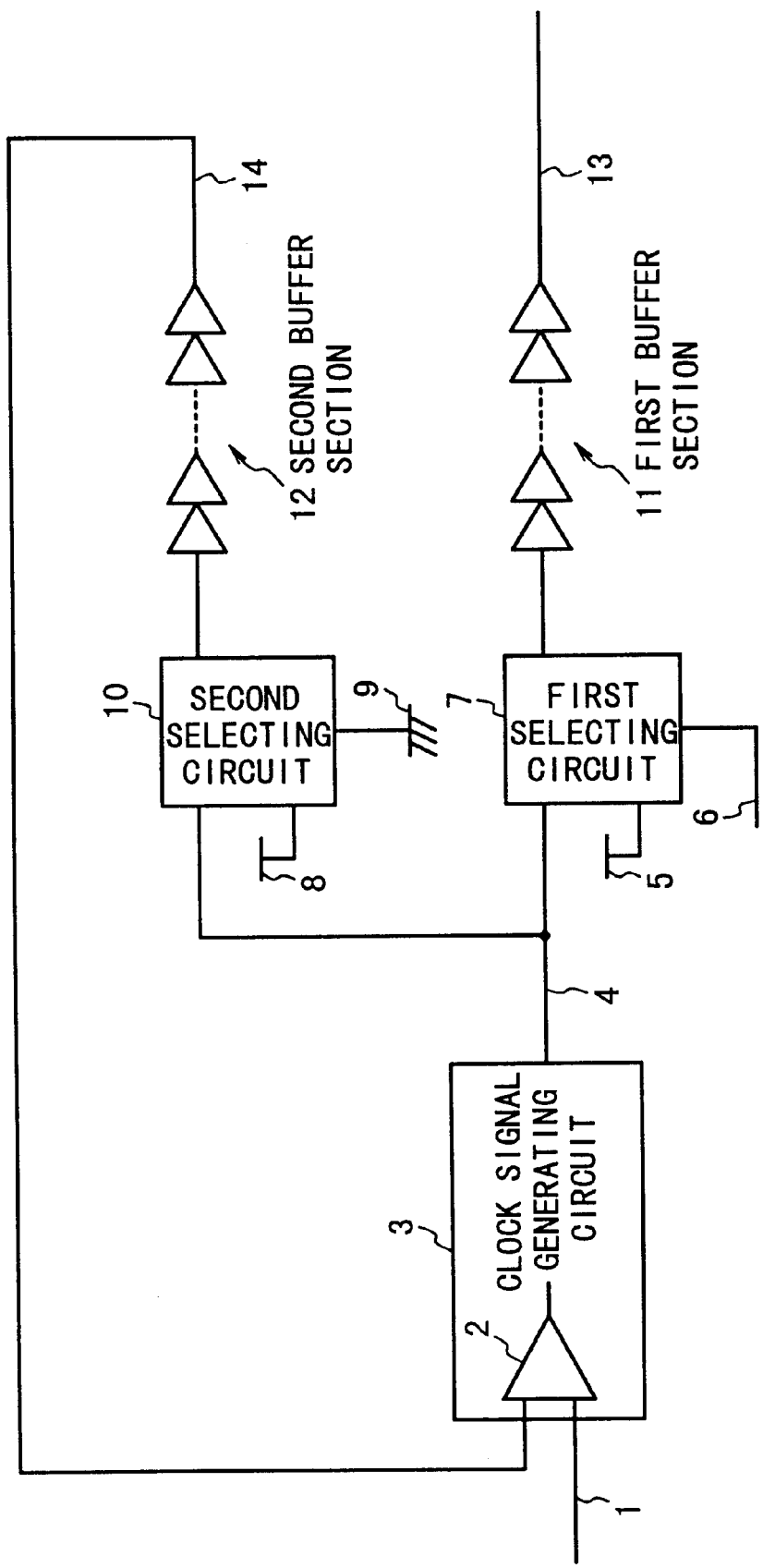
FIG. 1 is a block diagram illustrating the structure of the first conventional example of a phase adjusting circuit.
Figure 2:
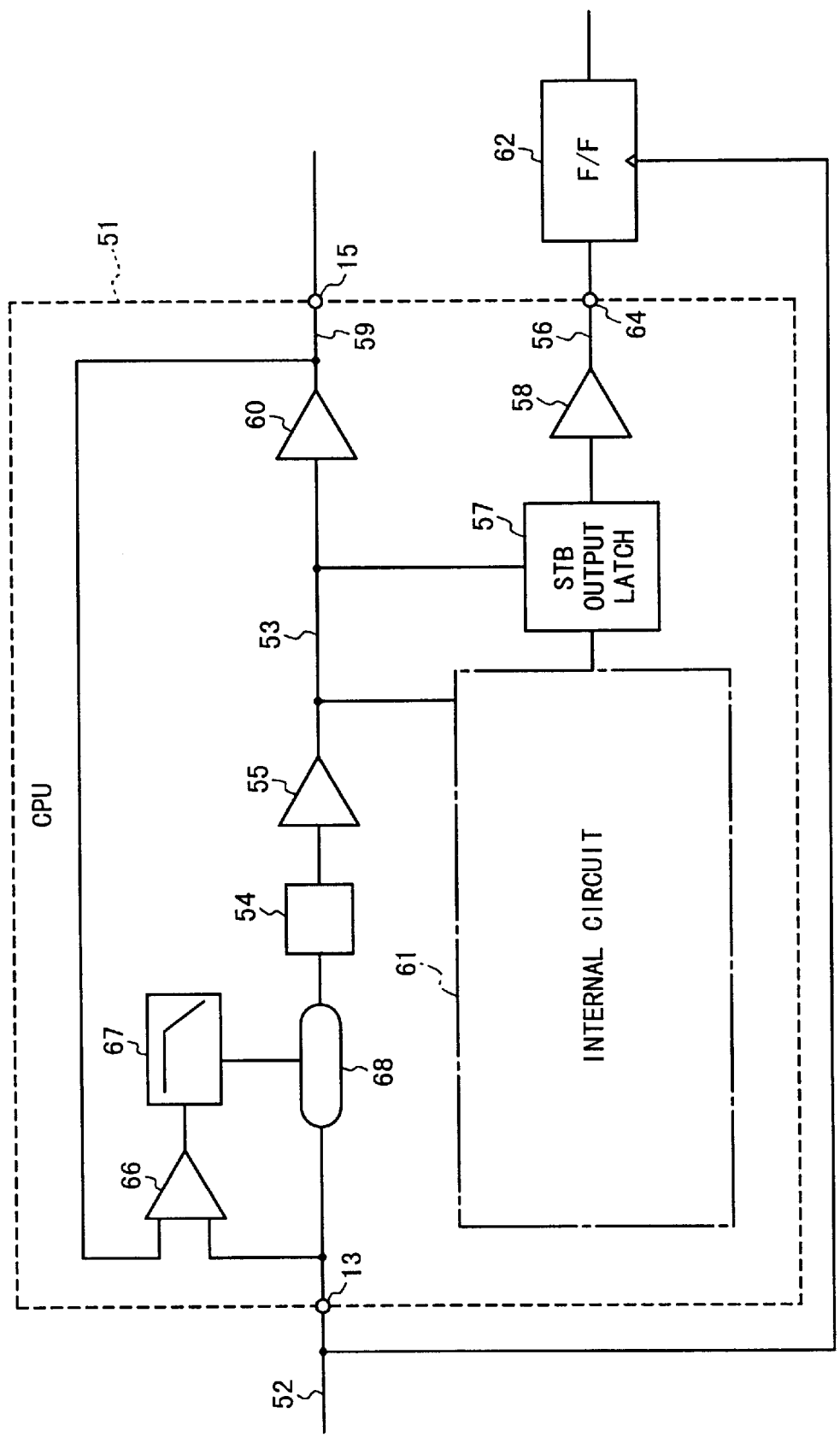
FIG. 2 is a block diagram illustrating the structure of the second conventional example of the phase adjusting circuit.
Figure 3:
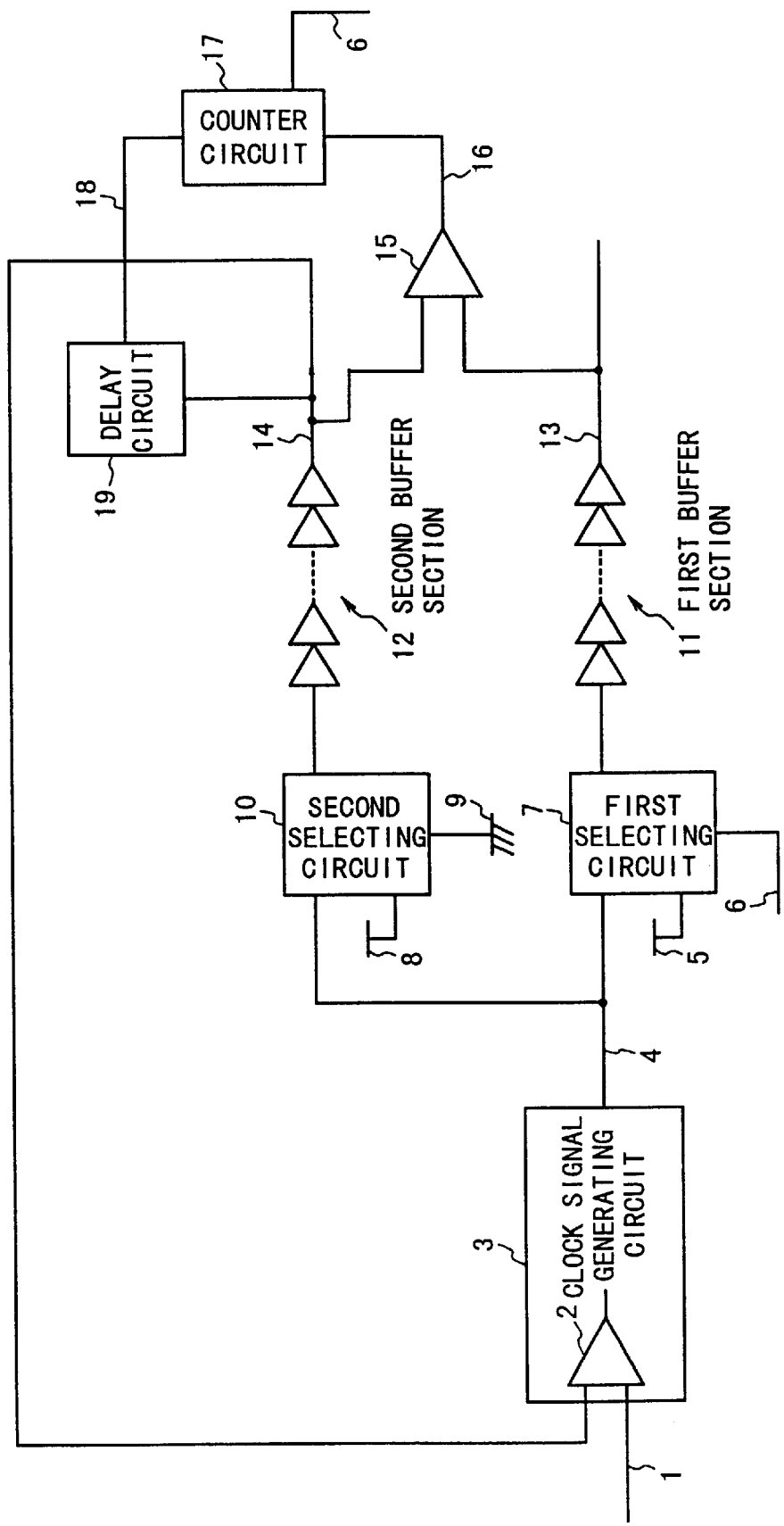
FIG. 3 is a block diagram illustrating the structure of a phase adjusting circuit according to the first embodiment of the present invention.

First, the phase adjusting circuit according to the first embodiment of the present invention will be described. FIG. 3 is a block diagram illustrating the structure of the phase adjusting circuit in the first embodiment. Referring to FIG. 3, the phase adjusting circuit is composed of a clock signal generating circuit 3 having a phase determining circuit 2, first and second selecting circuits 7 and 10, first and second buffer sections 11 and 12 each composed of buffer circuits, a phase determining circuit 15, a counter 17, and a delay circuit 19.

An external clock signal 1 is supplied to one of input terminals of the phase determining circuit 2 of the clock signal generating circuit 3. An output signal 4 of the clock signal generating circuit 3 is supplied to the first selecting circuit 7 and the second selecting circuit 10.

The first selecting circuit 7 outputs the output signal 4 of the clock signal generating circuit 3 via the first buffer section 11 as an internal clock signal 13. Also, the first selecting circuit 7 is supplied with an internal clock signal control signal 6 and a control signal 5 which is always set to a high potential. The first selecting circuit 7 controls the stop of the internal clock signal 13 in response to the internal clock signal control signal 6. The first buffer section 11 is connected to an output of the first selecting circuit 7. The first buffer section 11 buffers the output signal of the first selecting circuit 7 such that the internal clock signal 13 can drive a large load component.

The second selecting circuit 7 is supplied with an internal clock signal control signal 9 which is always grounded and a control signal 8 which is always set to a high potential. Thus, the second selecting circuit 10 always passes through the output signal 4 of the clock signal generating circuit 3. That is, the second selecting circuit 10 gives the output signal 4 of the clock signal generating circuit 4 the same delay as the first selecting circuit 7. The second buffer section 12 is connected to an output of the second selecting circuit 10. The second buffer section 12 buffers the output signal of the second selecting circuit 10 to provide a feed-back clock signal 14. The second buffer section 12 gives the output signal of the second selecting circuit 12 the same delay as the first buffer section 11. Therefore, the delay of the feed-back clock signal 14 from the output signal 4 of the clock signal generating circuit 3 due to the second selecting circuit 10 and the second buffer section 12 is almost the same as that of the internal clock signal 13 due to the first selecting circuit 7 and the first buffer section 11.

The phase determining circuit 15 compares the feed-back clock signal 14 and the internal clock signal 13 in phase. An output signal 16 of the phase determining circuit is supplied to the up/down counter circuit 17 as an up/down control signal. The counter circuit 17 operates in response to the up/down control signal 16 to count up or down an N-bit count value. Also, the counter circuit 17 has a function to maintain the N-bit count value in response to the internal clock signal control signal 6 without depending on the up/down control signal 16. A signal 18 indicative of the N-bit count value as the output of counter circuit 17 is supplied to the delay circuit 19. The delay circuit 19 controls the load for the feed-back clock signal 14 in response to the N-bit count value signal 18.

The phase determining circuit 15 always monitors the direction of the phase difference between feed-back clock signal 14 and the internal clock signal 13. When detecting that the internal clock signal 13 precedes the feed-back clock signal 14 in phase, the phase determining circuit 15 sets the up/down control signal 16 to the Low level. Also, when the internal clock signal 13 is delayed relative to the feed-back clock signal 14 in phase, the phase determining circuit 15 sets the up/down control signal 16 to the High level.

The counter circuit 17 changes the N-bit counter value signal 18 in accordance with the level of the up/down control signal 16, only when the internal clock signal 13 is activated. That is, the counter circuit 17 changes the N-bit count value signal 18 only when the internal clock signal stop control signal 6 is in the Low level. In this case, the counter circuit 17 counts down the N-bit count value by "1" when the up/down control signal 16 is in the Low level. On the other hand, when the up/down control signal 16 is in the High level, the counter circuit 17 counts up the N-bit count value by "1". When the internal clock signal stop control signal 6 is set to the High level, the counter circuit 17 holds the N-bit count value at that time, regardless of the up/down control signal 16. After that, when the internal clock signal stop control signal 6 is again set to the Low level, a signal 18 indicative of the previously held N-bit count value is outputted from the counter circuit 17 and then the control of count up or down of the N-bit count value is re-started.

Figure 5:
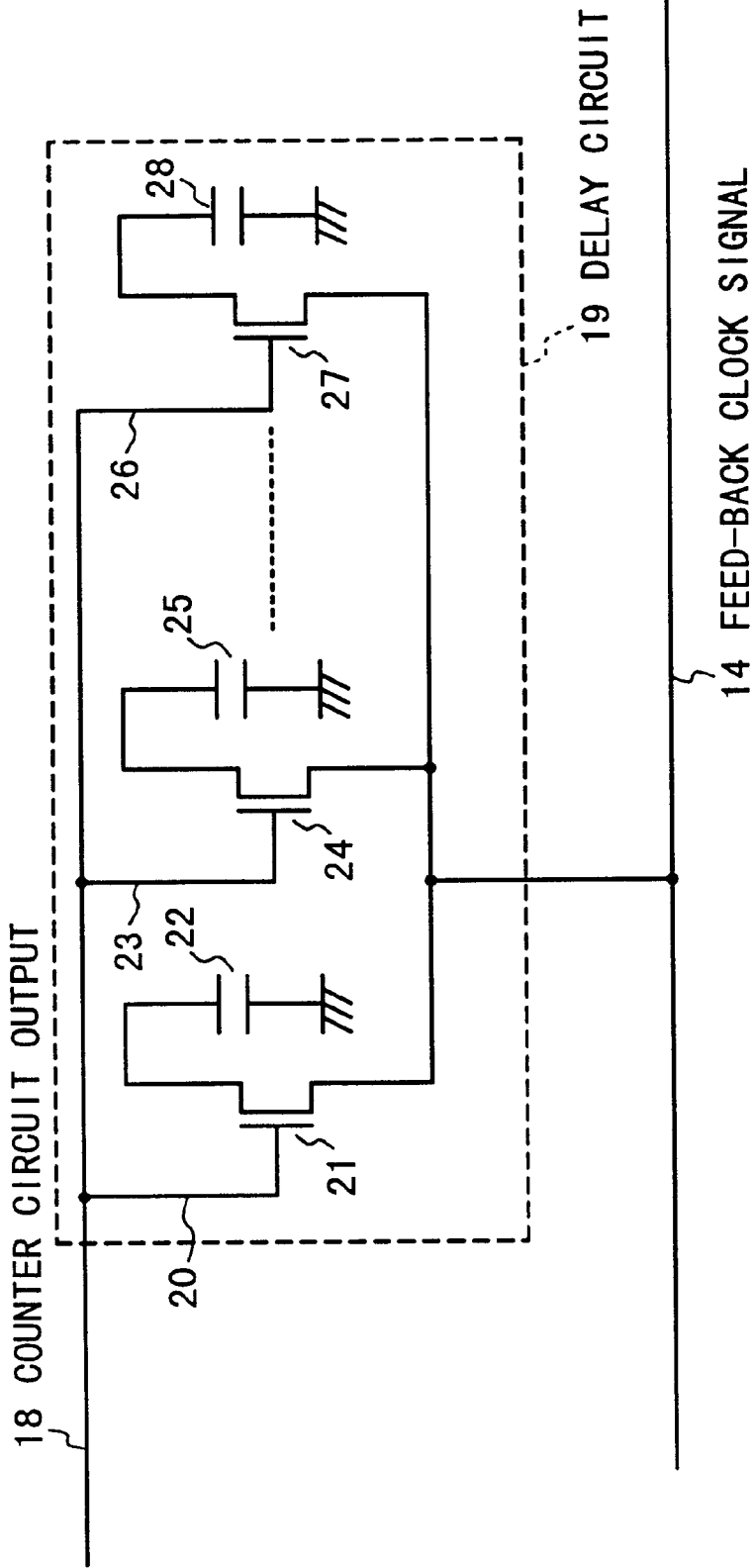
FIG. 5 is a circuit diagram illustrating the circuit structure of a load circuit of the phase adjusting circuit in the embodiments of the present invention.

The delay circuit 19 controls the load capacity which is imposed on the feed-back clock signal 14 in accordance with the N-bit count value signal 18. FIG. 5 shows an example of the circuit structure of the delay circuit 19 in the first embodiment. Referring to FIG. 5, the first bits 20, the second bit 23, . . . , the N-th bit 26 of the N-bit count value signal 18 are connected to gate terminals of MOS transistors 21, 24, . . . , 27. All sources of the MOS transistors 21, 24, . . . , 27 are connected to the ground via capacitors 22, 25, . . . , 28 which have different capacities from each other, respectively. The second capacitor 25 has twice of the capacity of the first capacitor 22 and the N-th capacitor 28 has $2^{(N-1)}$ times of the capacity of the first capacitor 22. All drains of the MOS transistors 22, 25, 27 are connected to the feed-back clock signal 14 in common. In this manner, the load capacitor determined in accordance with the N-bit count value signal 18 is applied to the feedback clock signal 14. That is, the load circuit 19 to the feed-back clock signal 14 functions to dynamically eliminate the phase difference between the internal clock signal 13 and the feed-back clock signal 14 due to the change of temperature in addition to the difference of device parameter every device, because the direction of the phase difference between the internal clock signal 13 and the feed-back clock signal 14 is always monitored by the phase determining circuit 15 when the internal clock signal 13 is activated or in the operating state, and a load to the feed-back clock signal is adjusted in accordance with the determination result of the phase determining circuit 15.

There was conventionally obtained a measuring result which indicates that there was a phase difference between the internal clock signal 13 and the feed-back clock signal about 10% of a period of the internal clock signal. However, according to the first embodiment of the present invention, the phase difference can be restrained to 1% or less, which corresponds to the non-sense band of the phase determining circuit 15.

Figure 4:
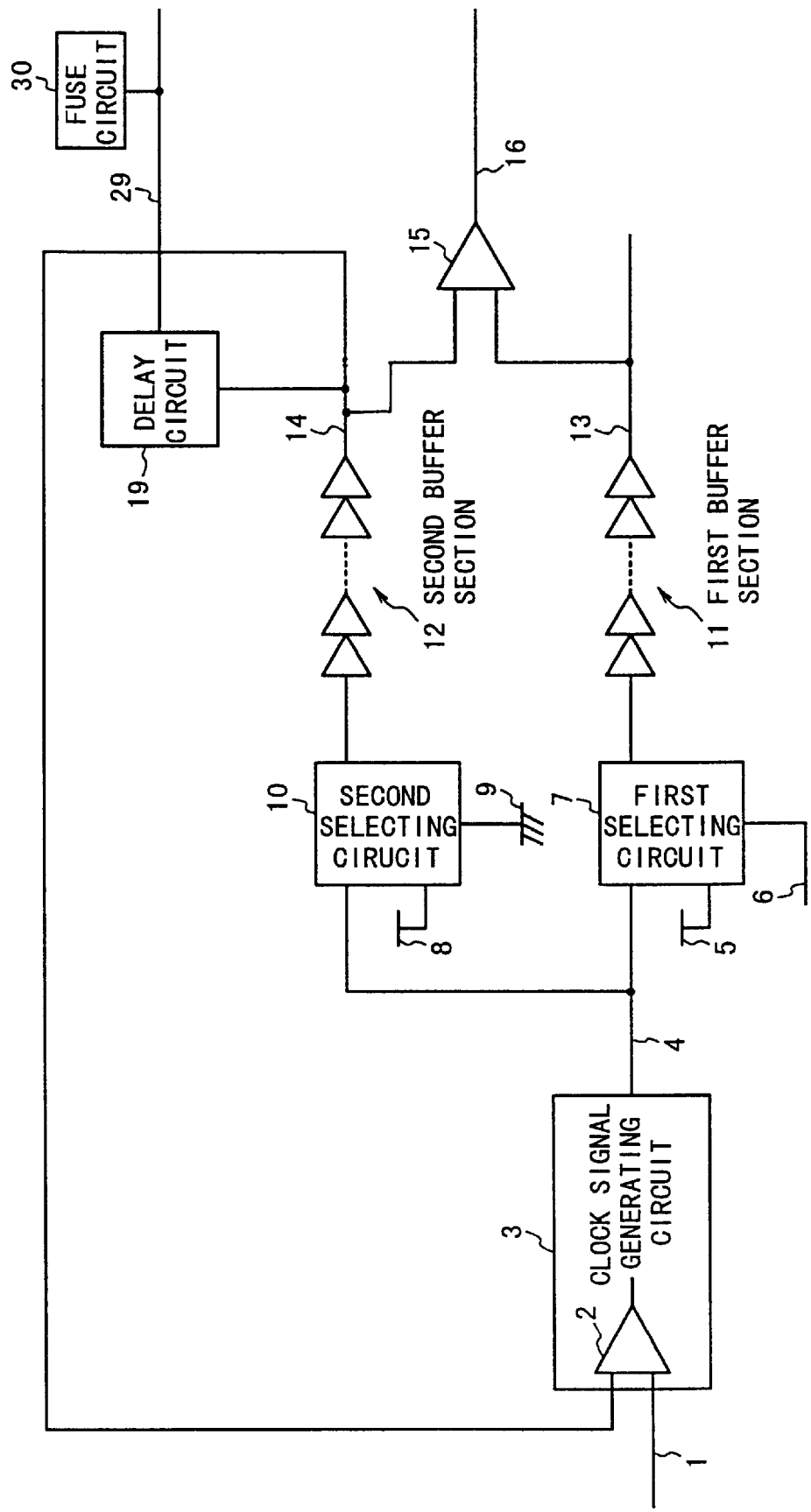
FIG. 4 is a block diagram illustrating the structure of the phase adjusting circuit according to the second embodiment of the present invention.

FIG. 4 is a block diagram which shows the structure of the phase adjusting circuit according to the second embodiment of the present invention. In the second embodiment, the counter circuit 17 in the above first embodiment is omitted. In the second embodiment, after the N-bit value 29 is determined and set in a fuse circuit 30 in the phase adjusting circuit. The N-bit value 29 is supplied to the delay circuit 19 from the fuse circuit 30.

Also, the output signal 16 of the phase determining circuit 15 is outputted outside the phase adjusting circuit. In this case, the phase adjusting circuit is designed in such a manner that the feed-back clock signal 14 precedes the internal clock signal 13 in phase when any load capacitor of the delay circuit 19 is not applied to the feed-back clock signal 14. Therefore, at this time, the phase determining circuit 15 outputs the control signal 16 having the High level.

For example, the N-bit value of the signal 29 is determined in the step of wafer test. In this case, the internal clock signal stop control signal 6 is fixed to the Low level. The external clock signal 1 is supplied from an LSI tester to the phase determining circuit 2 of the signal generating circuit 3 for the wafer test. While the N-bit value of the signal 29 is incremented one by one starting from, for example, "0", the output signal 16 of the phase determining circuit 15 continues to be monitored by the LSI tester. When the N-bit value of the signal 29 continues to be incremented one by one, the output signal 16 of the phase determining circuit 15 changes from the High level to the Low level. It could be possibly said that the N-bit value of the signal 29 in case of this change is a value when the phase difference between the feed-back clock signal 14 and the internal clock signal 13 is the least. The N-bit value of the signal 29 is stored in the LSI tester. After that, the fuse circuit 30 is cut in a fuse cut process in accordance with the N-bit value stored in the LSI tester such that the N-bit value is fixedly supplied to the delay circuit 19. As a result, the N-bit value of the signal 29 is not supplied from the external device but from the fuse circuit 30.

According to this method, because the N-bit value of the signal 29 is fixed in the device assembly, the phase adjusting circuit cannot measure temperature change at any time. However, the phase difference between the internal clock signal and the feed-back clock signal due to the device parameter which is different every device can be eliminated.

Also, because the up/down counter circuit 17 is unnecessary, it is favorable in the aspect of the device size.

As described above, according to the present invention, there can be eliminated the phase difference between the internal clock signal and the feed-back clock signal due to the difference in device parameter between devices and due to the difference between estimation in the design of the device and the actual device.

What is claimed is:

1. A phase adjusting circuit comprising:
    a signal generating circuit which generates an internal signal based on an external signal and a feed-back signal;
    an output circuit which outputs to a load circuit said internal signal having a first delay with respect to said generated internal signal from said signal generating circuit; and
    a feed-back signal generating circuit which delays said generated internal signal from said signal generating circuit by a sum of a second delay corresponding to said first delay and a third delay corresponding to a load of the load circuit, and which outputs the delayed signal as said feed-back signal to said signal generating circuit, said feed-back signal generating circuit including:
    a comparator which determines a phase difference between said internal signal having a first delay output from said output circuit and a first delayed signal, and a delay circuit which determines said third delay based on said phase difference.

2. A phase adjusting circuit according to claim 1, wherein said feedback signal generating circuit includes:
    first delaying means for delaying said generated internal signal from said signal generating circuit by said second delay corresponding to said first delay to generate said first delayed signal and wherein said delay circuit delays the first delayed signal by said third delay.

3. A phase adjusting circuit, comprising:
    a signal generating circuit which generates an internal signal based on an external signal and a feed-back signal;
    an output circuit which outputs to a load circuit said internal signal having a first delay with respect to said generated internal signal fro said signal generating circuit; and
    a feed-back signal generating circuit which delays said generated internal signal from said signal generating circuit by a sum of a second delay corresponding to said first delay and a third delay corresponding to a load of the load circuit, and for outputting the delay signal as said feed-back signal to said signal generating circuit, said feed-back signal generating circuit including:
    (a) first delaying means for delaying said generated internal signal from said signal generating circuit by said second delay corresponding to said first delay to generate a first delayed signal; and
    (b) second delaying means for delaying the first delayed signal by said third delay,
    wherein said second delaying means determines a phase difference between said internal signal having a first delay output from said output circuit and said first delayed signal, and delays said first delayed signal by said third delay signal determined based on said phase difference.

4. A phase adjusting circuit according to claim 3, wherein said second delaying means includes:
    a comparing circuit for detecting a direction of the phase difference between said internal signal having a first delay output from said output circuit and said first delayed signal;
    a counter circuit for counting up or down based on a detecting result of said comparing circuit; and
    a delaying circuit for delaying said first delayed signal by a delay corresponding to a count value from said counter circuit as said third delay.

5. A phase adjusting circuit according to claim 4, wherein said first delay means stops the output of said generated internal signal from said signal generating circuit to the load circuit in response to an output control signal, and said counter circuit holds the count value in response to the output control signal.

6. A phase adjusting circuit according to claim 4, wherein said count value is a N-bit data (N is an integer more than 1), and said delaying circuit includes:
    N capacitors having different capacitances, respectively; and
    N switching elements connected to said N capacitors, wherein said N switching elements are turned on in response to N bits of said count value, respectively, such that said first delayed signal is delayed by said third delay.

7. A phase adjusting circuit according to claim 6, wherein a M-th capacitor ($2 \leq M \leq N$: M is an integer) of said N capacitors has a capacitance of $L \times 2^{M-1}$ (L is a capacitance of a first capacitor).

8. A phase adjusting circuit according to claim 3, wherein said second delay ing means includes:
    a comparing circuit for detecting a direction of the phase difference between said internal signal having a first delay output from said output circuit and said first delayed signal;
    a value output circuit for outputting a fixed value previously set based on the detecting result of said comparing circuit; and
    a delaying circuit for delaying said first delayed signal by a delay corresponding to the fixed value from said value output circuit as said third delay.

9. A phase adjusting circuit according to claim 8, wherein said value is a N-bit data (N is an integer more than 1), and said delaying circuit includes:
    N capacitors having different capacitances, respectively; and
    N switching elements connected to said N capacitors, wherein said N switching elements are turned on in response to N bits of said count value, respectively, such that said first delayed signal is delayed by said third delay.

10. A phase adjusting circuit according to claim 9, wherein a M-th capacitor ($2 \leq M \leq N$: M is an integer) of said N capacitors has a capacitance of $L \times 2^{M-1}$ (L is a capacitance of a first capacitor).

11. A phase adjusting circuit, comprising:
    a signal generating circuit which generates an internal signal based on an external signal and a feed-back signal;
    an output circuit which outputs to a load circuit said internal signal having a first delay with respect to said generated internal signal from said signal generating circuit; and a feed-back signal generating circuit which monitors said internal signal, which dynamically delays by a sum of a second delay corresponding to said first delay and a third delay corresponding to a load of the load circuit, and which outputs the delayed signal as said feed-back signal to said signal generating circuit, said feedback signal generating circuit including:

a comparator which determines a phase difference between said internal signal having said first delay output from said output circuit and a first delayed signal, and a delay circuit which determines said third delay based on said phase difference.

12. A phase adjusting circuit, comprising:

a signal generating circuit which generates an internal signal based on an external signal and a feed-back signal;

an output circuit which outputs to a load circuit said internal signal having a first delay with respect to said generated internal signal from said signal generating circuit; and a feed-back signal generating circuit which monitors said internal signal, dynamically delaying by a sum of a second delay corresponding to said first delay and a third delay corresponding to a load of the load circuit, and which outputs the delayed signal as said feed-back signal to said signal generating circuit, wherein said feed-back signal generating circuit includes:

first delaying means for delaying said generated internal signal from said signal generating circuit by said second delay corresponding to said first delay to generate a first delayed signal;

a monitor circuit which monitors said internal signal; and second delaying means for determining said third delay based on the monitoring result of said monitor circuit, and for delaying said first delayed signal by said third delay.

13. A phase adjusting circuit according to claim 12, wherein said first delay means stops the output of said generated internal signal from said signal generating circuit to the load circuit in response to an output control signal, and said second delaying means holds said third delay in response to the output control signal.

14. A phase adjusting circuit according to claim 12, wherein said second delay means includes:

N capacitors having different capacitances, respectively; and

N switching elements connected to said N capacitors, wherein said N switching elements are turned on in response to the monitoring result of said monitor circuit, respectively, to determine said third delay.

15. A method of adjusting a clock signal, comprising the steps of:

generating an original clock signal based on an external signal and a feed-back signal;

generating and outputting to a load circuit an internal clock signal having a first delay with respect to said original clocks signal;

delaying said original clock signal by a sum of a second delay corresponding to said first delay and a third delay corresponding to load of the load circuit to generate said feed-back signal, said delaying step including:

determining a phase difference between said internal signal having said first delay output from said output circuit and a first delayed signal, said third delay being determined based on said phase difference.

16. A method, comprising:

generating an original clock signal based on an external signal and a feed-back signal;

generating and outputting to a load circuit an internal clock signal having a first delay with respect to said original clock signal; and delaying said original clock signal by a sum of a second delay corresponding to said first delay and a third delay corresponding to a load of the load circuit to generate said feed-back clock signal, wherein said delaying step includes:

applying said second delay to said original clock signal to generate a first delayed clock signal;

monitoring said internal clock signal; and applying to said first delayed clock signal said third delay determined based on a monitoring result of said internal clock signal to generate said feed-back clock signal.

17. A method according to claim 16, wherein said monitoring step includes always monitoring said internal clock signal, and wherein said step of applying said third delay includes:

dynamically changing a value of said third delay in accordance with the monitoring result;

holding the value of said third delay in response to an output stop signal, the generation of said internal clock signal being stopped in response to the output stop signal; and applying the changed value or held value of said third delay to said first delayed clock signal.

18. A method according to claim 16, wherein said step of applying said third delay includes:

applying to said first delayed clock signal said third delay previously determined based on the monitoring result.

* * * * *